(12) United States Patent
Eroz et al.

(10) Patent No.: US 7,483,496 B2
(45) Date of Patent: *Jan. 27, 2009

(54) METHOD AND SYSTEM FOR PROVIDING LONG AND SHORT BLOCK LENGTH LOW DENSITY PARITY CHECK (LDPC) CODES

(75) Inventors: Mustafa Eroz, Germantown, MD (US); Feng-Wen Sun, Germantown, MD (US); Lin-Nan Lee, Potomac, MD (US)

(73) Assignee: The DIRECTV Group, Inc., El Segundo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/938,071

(22) Filed: Nov. 9, 2007

(65) Prior Publication Data

US 2008/0065972 A1    Mar. 13, 2008

Related U.S. Application Data

(63) Continuation of application No. 10/971,509, filed on Oct. 22, 2004.

(60) Provisional application No. 60/518,199, filed on Nov. 7, 2003, provisional application No. 60/514,683, filed on Oct. 27, 2003.

(51) Int. Cl.
*H04L 27/00* (2006.01)
(52) U.S. Cl. .............................. 375/316; 714/758
(58) Field of Classification Search .................. 375/261, 375/295, 302, 308, 309, 316, 329; 714/758, 714/801
See application file for complete search history.

(56) References Cited

U.S. PATENT DOCUMENTS

| 7,334,181 | B2 | 8/2004 | Eroz et al. |
| 6,829,308 | B2 | 12/2004 | Eroz et al. |
| 6,895,547 | B2 | 5/2005 | Eleftheriou et al. |
| 7,000,168 | B2 * | 2/2006 | Kurtas et al. ............... 714/755 |
| 7,020,829 | B2 | 3/2006 | Eroz et al. |
| 2002/0051501 | A1 * | 5/2002 | Demjanenko et al. ....... 375/298 |
| 2004/0019845 | A1 | 1/2004 | Eroz et al. |
| 2004/0054960 | A1 | 3/2004 | Eroz et al. |
| 2004/0086059 | A1 | 5/2004 | Eroz et al. |

(Continued)

FOREIGN PATENT DOCUMENTS

CN    1405981    3/2003

(Continued)

OTHER PUBLICATIONS

U.S. Appl. No. 60/482,107, filed Jun. 24, 2003, Eroz et al.

(Continued)

*Primary Examiner*—Chieh M. Fan
*Assistant Examiner*—Freshteh N Aghdam

(57) ABSTRACT

An approach is provided for generating Low Density Parity Check (LDPC) codes. An LDPC encoder generates a LDPC code with an outer Bose Chaudhuri Hocquenghem (BCH) code. For 1/3 rate, the relevant parameters are as follows: $q=120$, $n_{ldpc}=64,800$, $k_{ldpc}=n_{BCH}=21600$, $k_{BCH}=21408$ (12 bit error correcting BCH). For 1/4 rate, the LDPC code has the following relevant parameters: $q=135$, $n_{ldpc}=64,800$, $k_{ldpc}=n_{BCH}=16200$, $k_{BCH}=16008$ (12 bit error correcting BCH). For 2/5 rate, the following parameters exist: $q=108$, $n_{ldpc}=64800$, $k_{ldpc}=n_{BCH}=25920$, $k_{BCH}=25728$ (12 bit error correcting BCH). The above approach has particular application in digital video broadcast services over satellite.

24 Claims, 9 Drawing Sheets

U.S. PATENT DOCUMENTS

| | | | |
|---|---|---|---|
| 2004/0268205 A1* | 12/2004 | Stolpman | 714/758 |
| 2005/0063484 A1 | 3/2005 | Eroz et al. | |
| 2005/0091565 A1 | 4/2005 | Eroz et al. | |
| 2005/0091570 A1 | 4/2005 | Eroz et al. | |
| 2005/0166133 A1 | 7/2005 | Eroz et al. | |
| 2005/0262424 A1 | 11/2005 | Tran et al. | |
| 2005/0268206 A1 | 12/2005 | Tran et al. | |

FOREIGN PATENT DOCUMENTS

| | | |
|---|---|---|
| JP | 2001-345716 | 12/2001 |
| WO | WO 01/97387 | 12/2001 |

OTHER PUBLICATIONS

Nieda, Satoshi et al.; "Low-Density Parity-Check Codes for Decoding Algorithm Based on Belief Propagation"; Technical Report of IEICE; IT20C3-32; Jul. 2003; The Institute of Electronics, Information and Communication Engineers.

Wadayama, Tadashi; "A Coded Modulation Scheme Based on Low Density Parity Check Codes"; IEICE Trans. Fundamentals; vol. E84-A, No. 10 Oct. 2001; Paper—Special Issue on a Special Issue of IEICE Transactions.

Yi, Yu et al.; "Design of Semi-Algebraic Low-Density Parity Check (SA-LDPC) Codes for Multilevel Coded Modulation"; Institute of Information & Communications; Chonbuk National University; ChonJu 561-756, Korea; pp. 931-934; XP-010661473, Aug. 2003.

Lee, Lin-Nan; "LDPC Codes, Application to Next Generation Communication Systems"; Hughes Network Systems; Germantown, Maryland; Oct 8, 2003; pp. 1-8; XP-00231-11763.

Mansour, Mohammad M. et al.; "Low-Power VLSI Decoder Architectures for LDPC Codes"; ICIMS Research Center; ECE Dept., Coordinated Science Laboratory, University of Illinois at Urbana-Champaign, Urbana, IL; pp. 284-289; XP-010600916, Aug. 2002.

Mansour, Mohommad M. et al.; "Architecture-Aware Low-Density Parity-Check Codes"; Coordinated Science Laboratory, ECE Department University of Illinois at Urbana-Champaign; Urbana, Illinois; pp. 57-60; XP002302888, May 2003.

Le Goff, S.Y.; "Channel Capacity of Bit-Interleaved Coded Modulation Schemes Using 8-ary Signal Constellations"; Electronics Letters IEE; Stevenage, Great Britain; vol. 38, No. 4; Feb. 14, 2002; pp. 187-189; XP006017828; ISSN: 0013-5194.

Le Goff, S.Y.; "Signal Constellations for Bit-Interleaved Coded Modulation"; IEEE Transactions on Information Theory; vol. 49, No. 1; Jan. 2003; pp. 307-313; XP002322414.

Le Goff, S.Y.; "Signalling Constellations for Power-Efficient Bit-Interleaved Coded Modulation Schemes"; IEEE Proceedings: Communications, Institution of Electrical Engineers; Great Britain; vol. 150, No. 3; Jun. 13, 2003; pp. 141-148; XP006020427; ISSN 1350-2425.

Hou, J.; Siegel, P.H.; Milstein, L.B.; Pfister, H.D.; "Capacity-Approaching Bandwidth-Efficient Coded Modulation Schemes Based on Low- Density Parity-Check Codes"; IEEE Transactions on Information Theory; vol. 49, No. 9; Sep. 1, 2003; pp. 2141-2155; XP002322415.

Calzolari, Gian Paolo.; "Report on DVB-S2 Channel Coding Standardization Effort"; Sub-Panel Channel Coding Meeting Report; Matera, Italy; Apr. 7, 2003; pp. 1-11; XP002311762.

Selvarathinam, Anand et al.; "A Massively Scaleable Decoder Architecture for Low-Density Parity-Check Codes"; Department of Electrical Engineering, Texas A&M University; College Station, Texas; pp. 61-64; XP00226092; May 2003.

Hocevar, Dale E.; "LDPC Code Construction with Flexible Hardware Implementation"; DSP Solutions R&D Center, Texas Instruments; Dallas, Texas; pp. 2708-2712, May 2003.

Draft ETSI EN 302 307 V1.1.1.1; "Second Generation Framing Structure, Channel Coding and Modulation Systems for Broadcasting, Interactive Services, News Gathering and Other Broadband Satellite Applications"; European Standard (Telecommunications series); Digital Video Broadcasting (DVB); pp. 1-74, Jun. 2004.

Eleftheroiou, E. and Olcer, S; "Low-Density Parity-Check Codes for Digital Subscriber Lines"; IBM Research, Zurich Research Laboratory; 8803 Ruschlikon, Switzerland; pp. 1752-1757, May 2002.

Richardson, Tom; Urbanke, Rudiger; "Capacity Approaching Codes, Iterative Decoding Algorithms, and Their Applications, The Renaissance of Gallagher's Low-Density Parity-Check Codes"; Flarion Technologies and EPFL; IEEE Communications Magazine; Aug. 2003; pp. 126-131; XP-001177711.

Richardson, Thomas J.; Urbanke, Rudiger; "Efficient Encoding of Low-Density Parity-Check Codes"; pp. 638, 656; XP-002965294, Feb. 2001.

ETSI EN 301 790 V1.3.1.; European Standard (Telecommunications Series), Digital Video Broadcasting (DVB); Interaction Channel for Satellite Distribution Systems; pp. 1-110; XP-014003845, Mar. 2003.

Narayanaswami, Ravi; "Coded Modulation with Low Density Parity Check Codes"; a Thesis submitted to the Office of Graduate Studies of Texas A&M University in partial fulfillment of the requirement for the degree of Master of Science; Jun. 2001; pp. 1-78; XP-002271230.

Yang, Michael; Ryan, William E.; "Lowering the Error-Rate Floors of Moderate-Length High-Rate Irregular LDPC Codes"; Department of Electrical and Compute Engineering, University of Arizona; Tucson, Arizona 85721; p. 237, Jun. 2003.

Yang, Michael; Li, Yan; Ryan, William E.; "Designing of Efficiently Encodable Moderate-Length High-Rate Irregular LDPC Codes"; Department of Electrical and Computer Engineering, University of Arizona; Tucson, Arizona 85721; Sep. 27, 2002; pp. 1415-1424, Sep. 2002.

Zhang, Tong; Parhi, Keshab K.; "Joint Cope and Decoder Design for Implementation-Oriented (3, k)-regular LDPC Codes"; Department of Electrical and Computer Engineering, University of Minnesota; Minneapolis, MN 55455; pp. 1232-1236, Nov. 2001.

Gallagher, R.G.; "Low Density Parity-Check Codes"; pp. 21-28; XP-000992693, Jan. 1962.

* cited by examiner $$H = \begin{bmatrix} n_1 & n_2 & n_3 & n_4 & n_5 & n_6 & n_7 & n_8 \\ 1 & 0 & 1 & 0 & 1 & 0 & 0 & 1 \\ 0 & 1 & 1 & 0 & 1 & 0 & 1 & 0 \\ 1 & 0 & 0 & 1 & 0 & 1 & 0 & 1 \\ 0 & 1 & 0 & 1 & 0 & 1 & 1 & 0 \end{bmatrix} \begin{matrix} m_1 \\ m_2 \\ m_3 \\ m_4 \end{matrix}$$

$$B = \begin{bmatrix} 1 & x & x & x & x & x & x & 1 \\ x & 1 & x & x & x & x & 1 & x \\ x & x & 1 & x & x & 1 & x & x \\ x & x & x & 1 & 1 & x & x & x \end{bmatrix} \mathbf{0}$$

METHOD AND SYSTEM FOR PROVIDING LONG AND SHORT BLOCK LENGTH LOW DENSITY PARITY CHECK (LDPC) CODES

RELATED APPLICATIONS

This application is a continuation of U.S. application (Ser. No. 10/971,509), filed Oct. 22, 2004, entitled "Method and System for Providing Long and Short Block Length Low Density Parity Check (LDPC) Codes," which claims the benefit of the earlier filing date under 35 U.S.C. §119(e) of U.S. Provisional Application (Ser. No. 60/514,683), filed Oct. 27, 2003, entitled "Rate 1/3 and 1/4 LDPC Code," and U.S. Provisional Application (Ser. No. 60/518,199), filed Nov. 7, 2003, entitled "Rate 1/3, 1/4 and 2/5 LDPC Code"; the entireties of which are incorporated herein by reference.

FIELD OF THE INVENTION

The present invention relates to communication systems, and more particularly to coded systems.

BACKGROUND OF THE INVENTION

Communication systems employ coding to ensure reliable communication across noisy communication channels. For example, in a wireless (or radio) system, such as a satellite network, noise sources abound, from geographic and environmental factors. These communication channels exhibit a fixed capacity that can be expressed in terms of bits per symbol at certain signal to noise ratio (SNR), defining a theoretical upper limit (known as the Shannon limit). As a result, coding design has aimed to achieve rates approaching this Shannon limit. This objective is particularly germane to bandwidth constrained satellite systems. One such class of codes that approach the Shannon limit is Low Density Parity Check (LDPC) codes.

Traditionally, LDPC codes have not been widely deployed because of a number of drawbacks. One drawback is that the LDPC encoding technique is highly complex. Encoding an LDPC code using its generator matrix would require storing a very large, non-sparse matrix. Additionally, LDPC codes require large blocks to be effective; consequently, even though parity check matrices of LDPC codes are sparse, storing these matrices is problematic.

From an implementation perspective, a number of challenges are confronted. For example, storage is an important reason why LDPC codes have not become widespread in practice. Length LDPC codes, thus, require greater storage space. Also, a key challenge in LDPC code implementation has been how to achieve the connection network between several processing engines (nodes) in the decoder. Further, the computational load in the decoding process, specifically the check node operations, poses a problem.

Therefore, there is a need for an LDPC communication system that employs simple encoding and decoding processes. There is also a need for using LDPC codes efficiently to support high data rates, without introducing greater complexity. There is also a need to improve performance of LDPC encoders and decoders. There is also a need to minimize storage requirements for implementing LDPC coding.

SUMMARY OF THE INVENTION

These and other needs are addressed by the present invention, wherein an approach for encoding Low Density Parity Check (LDPC) codes is provided. An encoder generates a LDPC code having an outer Bose Chaudhuri Hocquenghem (BCH) code according to one of Tables 1-6 for transmission as the LDPC coded signal. Each of the Tables 1-6 specifies the address of parity bit accumulators. The approach advantageously provides expedient encoding as well as decoding of LDPC codes, while minimizing storage and processing resources.

According to another aspect of an embodiment of the present invention, the LDPC codes are represented by signals that are modulated according to a signal constellation that includes one of 8-PSK (Phase Shift Keying), 16-QAM (Quadrature Amplitude Modulation), QPSK (Quadrature Phase Shift Keying), 16-APSK (Amplitude Phase Shift Keying) and 32-APSK.

According to yet another aspect of an embodiment of the present invention, the modulated LDPC coded signal is transmitted over a satellite link in support of a broadband satellite application.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawings and description are to be regarded as illustrative in nature, and not as restrictive.

BRIEF DESCRIPTION OF THE DRAWINGS

The present invention is illustrated by way of example, and not by way of limitation, in the figures of the accompanying drawings and in which like reference numerals refer to similar elements and in which.

DESCRIPTION OF THE PREFERRED EMBODIMENT

A system, method, and software for efficiently encoding short frame length Low Density Parity Check (LDPC) codes are described. In the following description, for the purposes of explanation, numerous specific details are set forth in order to provide a thorough understanding of the present invention. It is apparent, however, to one skilled in the art that the present invention may be practiced without these specific details or with an equivalent arrangement. In other instances, well-known structures and devices are shown in block diagram form in order to avoid unnecessarily obscuring the present invention.

Figure 1:
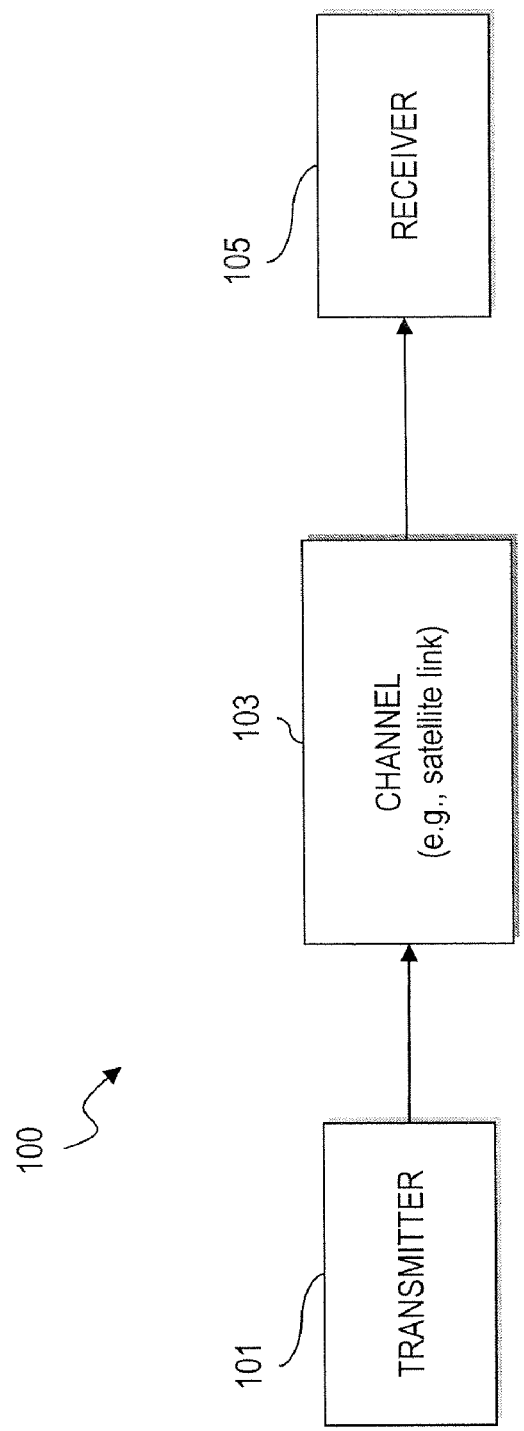
FIG. 1 is a diagram of a communications system configured to utilize Low Density Parity Check (LDPC) codes, according to an embodiment of the present invention.

FIG. 1 is a diagram of a communications system configured to utilize Low Density Parity Check (LDPC) codes, according to an embodiment of the present invention. A digital communications system 100 includes a transmitter 101 that generates signal waveforms across a communication channel 103 to a receiver 105. In this discrete communications system 100, the transmitter 101 has a message source that produces a discrete set of possible messages; each of the possible messages has a corresponding signal waveform. These signal waveforms are attenuated, or otherwise altered, by communications channel 103. To combat the noise in the channel 103, LDPC codes are utilized.

By way of example, the channel 103 is a satellite link serving satellite terminals (e.g., Very Small Aperture Terminals (VSATs)) in support of broadband satellite applications. Such applications include satellite broadcasting and interactive services (and compliant with the Digital Video Broadcast (DVB)—S2 standard). The Digital Video Broadcasting via Satellite (DVB-S) standard has been widely adopted worldwide to provide, for instance, digital satellite television programming.

The LDPC codes that are generated by the transmitter 101 enable high speed implementation without incurring any performance loss. These structured LDPC codes output from the transmitter 101 avoid assignment of a small number of check nodes to the bit nodes already vulnerable to channel errors by virtue of the modulation scheme (e.g., 8-PSK).

Such LDPC codes have a parallelizable decoding algorithm (unlike turbo codes), which advantageously involves simple operations such as addition, comparison and table look-up. Moreover, carefully designed LDPC codes do not exhibit any sign of error floor.

According to one embodiment of the present invention, the transmitter 101 generates, using a relatively simple encoding technique, LDPC codes based on parity check matrices (which facilitate efficient memory access during decoding) to communicate with the receiver 105. The transmitter 101 employs LDPC codes that can outperform concatenated turbo+RS (Reed-Solomon) codes, provided the block length is sufficiently large.

Figure 2A:
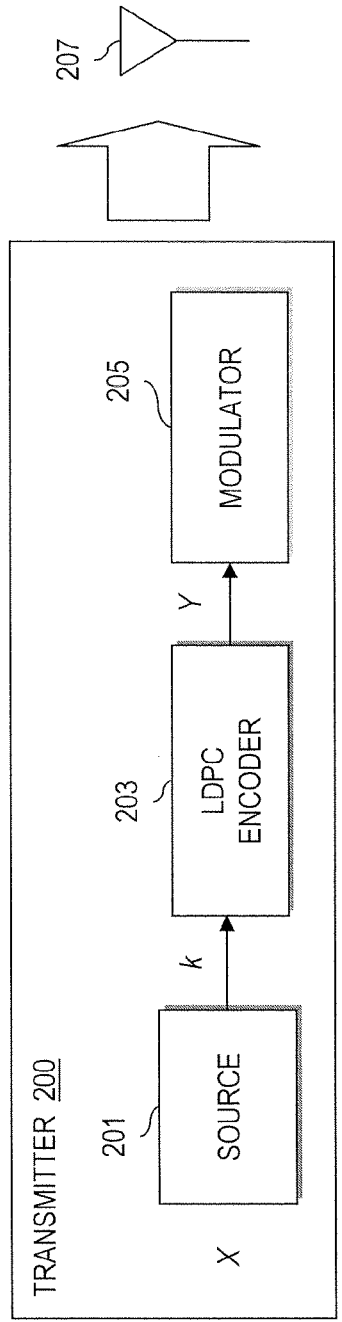
FIGS. 2A and 2B are diagrams of exemplary LDPC encoders deployed in the transmitter of FIG. 1.
Figure 2B:
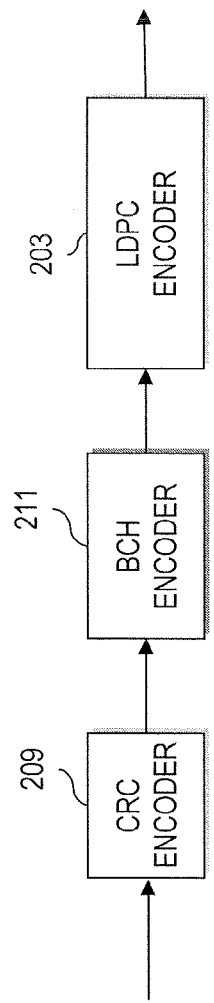

FIGS. 2A and 2B are diagrams of exemplary LDPC encoders deployed in the transmitter of FIG. 1. As seen in FIG. 2A, a transmitter 200 is equipped with an LDPC encoder 203 that accepts input from an information source 201 and outputs coded stream of higher redundancy suitable for error correction processing at the receiver 105. The information source 201 generates k signals from a discrete alphabet, X. LDPC codes are specified with parity check matrices. On the other hand, encoding LDPC codes require, in general, specifying the generator matrices. Even though it is possible to obtain generator matrices from parity check matrices using Gaussian elimination, the resulting matrix is no longer sparse and storing a large generator matrix can be complex.

The encoder 203 generates signals from alphabet Y to a modulator 205 using a simple encoding technique that makes use of only the parity check matrix by imposing structure onto the parity check matrix. Specifically, a restriction is placed on the parity check matrix by constraining certain portion of the matrix to be triangular. The construction of such a parity check matrix is described more fully below in FIG. 6. Such a restriction results in negligible performance loss, and therefore, constitutes an attractive trade-off.

The modulator 205 maps the encoded messages from encoder 203 to signal waveforms that are transmitted to a transmit antenna 207, which emits these waveforms over the communication channel 103. Accordingly, the encoded messages are modulated and distributed to a transmit antenna 207. The transmissions from the transmit antenna 207 propagate to a receiver (shown in FIG. 3), as discussed below.

FIG. 2B shows an LDPC encoder utilized with a Bose Chaudhuri Hocquenghem (BCH) encoder and a cyclic redundancy check (CRC) encoder, according to one embodiment of the present invention. Under this scenario, the codes generated by the LDPC encoder 203, along with the CRC encoder 209 and the BCH encoder 211, have a concatenated outer BCH code and an inner low density parity check (LDPC) code. Furthermore, error detection is achieved using cyclic redundancy check (CRC) codes. The CRC encoder 209, in an exemplary embodiment, encodes using an 8-bit CRC code with generator polynomial $(x^5+x^4+x^3+x^2+1)(x^2+x+1)(x+1)$. The CRC code is output to the BCH encoder 211.

Figure 2C:
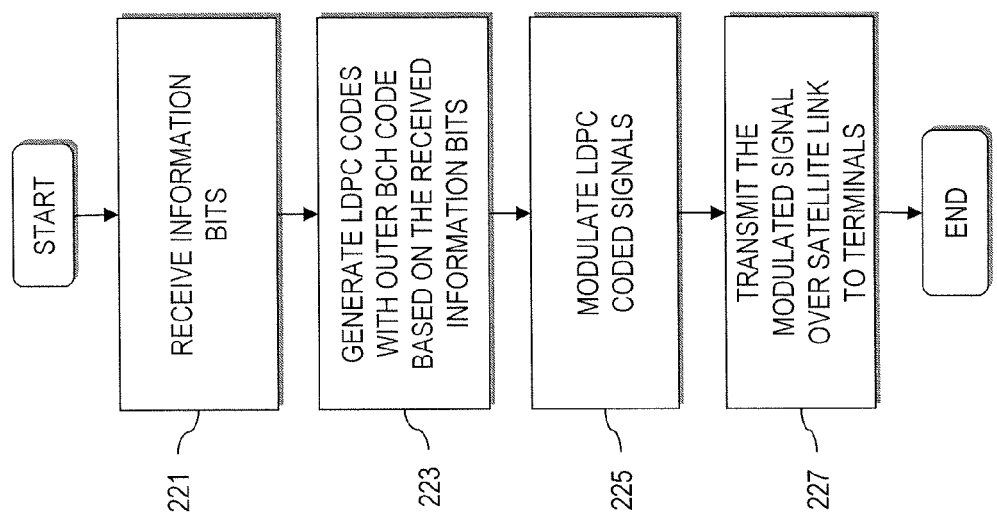
FIGS. 2C and 2D are flowcharts of the encoding process of the LDPC encoder of FIG. 2B for generating, respectively, long frame length codes and short frame length LDPC codes, according to an embodiment of the present invention.

FIG. 2C is a flowchart of the encoding process of the LDPC encoder of FIG. 2B for generating long frame length LDPC codes, according to an embodiment of the present invention. In step 221, information bits are received and processed to the chain of encoders 209, 211, and 203. Consequently, the LDPC encoder 203 generates LDPC codes with outer BCH codes based on the received information bits, as in step 223. The codes also contain the CRC code. Next, the LDPC codes are represented by signals that are modulated, per step 225, for transmission over the channel 103, which in an exemplary embodiment, is a satellite link to one or more satellite terminals (step 227).

The LDPC encoder 203 systematically encodes an information block of size $k_{ldpc}$, $i=(i_0, i_1, \ldots, i_{k_{ldpc}-1})$ onto a codeword of size $n_{ldpc}$, $c=(i_0, i_1, \ldots, i_{k_{ldpc}-1}, p_0, p_1, \ldots p_{n_{ldpc}-k_{ldpc}-1})$. The transmission of the codeword starts in the given order from $i_0$ and ends with $p_{n_{ldpc}-k_{ldpc}-1}$ LDPC code parameters $(n_{ldpc}, k_{ldpc})$.

The task of the LDPC encoder 203 is to determine $n_{ldpc}-k_{ldpc}$ parity bits $(p_0, p_1, \ldots, p_{n_{ldpc}-k_{ldpc}-1})$ for every block of $k_{ldpc}$ information bits, $(i_0, i_1, \ldots, i_{k_{ldpc}-1})$. The procedure is as follows. First, the parity bits are initialized; $p_0=p_1=p_2=\ldots=p_{n_{ldpc}-k_{ldpc}-1}=0$. By way of example, $k_{ldpc}$ bits are systematically encoded to generate $n_{ldpc}$ bits. The first information bit, $i_0$, are accumulated at parity bit addresses specified in the first row of Tables 1-3. For the 1/3 rate code of Table 1, the relevant parameters are as follows: q=120, $n_{ldpc}$=64800, $k_{ldpc}=n_{BCH}$=21600, $k_{BCH}$=21408 (12 bit error correcting BCH). For the 1/4 rate, the LDPC code has the following relevant parameters: q=135, $n_{ldpc}$=64800, $k_{ldpc}=n_{BCH}$=16200, $k_{BCH}$=16008 (12 bit error correcting BCH). For long 2/5 LDPC code, the following parameters exist: q=108, $n_{ldpc}$=64800, $k_{ldpc}=n_{BCH}$=25920, $k_{BCH}$=25728 (12 bit error correcting BCH).

For example, for rate 1/3 (Table 1), the following results for $i_0$:

$$p_{34903} = p_{34903} \oplus i_0$$
$$p_{20927} = p_{20927} \oplus i_0$$
$$p_{32093} = p_{32093} \oplus i_0$$
$$p_{1052} = p_{1052} \oplus i_0$$
$$p_{25611} = p_{25611} \oplus i_0$$
$$p_{16093} = p_{16093} \oplus i_0$$
$$p_{16454} = p_{16454} \oplus i_0$$
$$p_{5520} = p_{5520} \oplus i_0$$
$$p_{506} = p_{506} \oplus i_0$$
$$p_{37399} = p_{37399} \oplus i_0$$
$$p_{18518} = p_{18518} \oplus i_0$$
$$p_{21120} = p_{21120} \oplus i_0$$

In the above equations, the additions are in GF(2)).

Then, for the next 359 information bits, $i_m$, m=1, 2, ..., 359, these bits are accumulated at parity bit addresses {x+m mod 360×q} mod($n_{ldpc} - k_{ldpc}$), where x denotes the address of the parity bit accumulator corresponding to the first bit $i_0$, and q is a code rate dependent constant. Continuing with the example with q=120 for rate 1/3, for information bit $i_1$, the following operations are performed:

$$p_{35023} = p_{35023} \oplus i_1$$
$$p_{21047} = p_{21047} \oplus i_1$$
$$p_{32213} = p_{32213} \oplus i_1$$
$$p_{1172} = p_{1172} \oplus i_1$$
$$p_{25731} = p_{25731} \oplus i_1$$
$$p_{16574} = p_{16574} \oplus i_1$$
$$p_{16574} = p_{16574} \oplus i_1$$
$$p_{5640} = p_{5640} \oplus i_1$$
$$p_{626} = p_{626} \oplus i_1$$
$$p_{37519} = p_{37519} \oplus i_1$$
$$p_{18638} = p_{18638} \oplus i_1$$
$$p_{21240} = p_{21240} \oplus i_1$$

For the 361$^{st}$ information bit $i_{360}$, the addresses of the parity bit accumulators are given in the second rows of Tables 1-3. In a similar manner the addresses of the parity bit accumulators for the following 359 information bits $i_m$, m=361, 362, ..., 719 are obtained using the formula {x+m mod360×q} mod ($n_{ldpc} - k_{ldpc}$), where x denotes the address of the parity bit accumulator corresponding to the information bit $i_{360}$, i.e., the entries in the second row of the Tables 1-3. In a similar manner, for every group of 360 new information bits, a new row from Tables 1-3 are used to find the addresses of the parity bit accumulators.

TABLE 1

Address of Parity Bit Accumulators (Rate 1/3)

34903 20927 32093 1052 25611 16093 16454 5520 506 37399 18518 21120
11636 14594 22158 14763 15333 6838 22222 37856 14985 31041 18704 32910
17449 1665 35639 16624 12867 12449 10241 11650 25622 34372 19878 26894
29235 19780 36056 20129 20029 5457 8157 35554 21237 7943 13873 14980
9912 7143 35911 12043 17360 37253 25588 11827 29152 21936 24125 40870
40701 36035 39556 12366 19946 29072 16365 35495 22686 11106 8756 34863
19165 15702 13536 40238 4465 40034 40590 37540 17162 1712 20577 14138
31338 19342 9301 39375 3211 1316 33409 28670 12282 6118 29236 35787
11504 30506 19558 5100 24188 24738 30397 33775 9699 6215 3397 37451
34689 23126 7571 1058 12127 27518 23064 11265 14867 30451 28289 2966
11660 15334 16867 15160 38343 3778 4265 39139 17293 26229 42604 13486
31497 1365 14828 7453 26350 41346 28643 23421 8354 16255 11055 24279
15687 12467 13906 5215 41328 23755 20800 6447 7970 2803 33262 39843
5363 22469 38091 28457 36696 34471 23619 2404 24229 41754 1297 18563
3673 39070 14480 30279 37483 7580 29519 30519 39831 20252 18132 20010
34386 7252 27526 12950 6875 43020 31566 39069 18985 15541 40020 16715
1721 37332 39953 17430 32134 29162 10490 12971 28581 29331 6489 35383
736 7022 42349 8783 6767 11871 21675 10325 11548 25978 431 24085
1925 10602 28585 12170 15156 34404 8351 13273 20208 5800 15367 21764
16279 37832 34792 21250 34192 7406 41488 18346 29227 26127 25493 7048
39948 28229 24899
17408 14274 38993
38774 15968 28459
41404 27249 27425
41229 6082 43114
13957 4979 40654
3093 3438 34992
34082 6172 28760
42210 34141 41021
14705 17783 10134
41755 39884 22773
14615 15593 1642
29111 37061 39860
9579 33552 633
12951 21137 39608
38244 27361 29417

TABLE 1-continued

Address of Parity Bit Accumulators (Rate ⅓)

2939 10172 36479
29094 5357 19224
9562 24436 28637
40177 2326 13504
6834 21583 42516
40651 42810 25709
31557 32138 38142
18624 41867 39296
37560 14295 16245
6821 21679 31570
25339 25083 22081
8047 697 35268
9884 17073 19995
26848 35245 8390
18658 16134 14807
12201 32944 5035
25236 1216 38986
42994 24782 8681
28321 4932 34249
4107 29382 32124
22157 2624 14468
38788 27081 7936
4368 26148 10578
25353 4122 39751

TABLE 2

Address of Parity Bit Accumulators (Rate ¼)

23606 36098 1140 28859 18148 18510 6226 540 42014 20879 23802 47088
16419 24928 16609 17248 7693 24997 42587 16858 34921 21042 37024 20692
1874 40094 18704 14474 14004 11519 13106 28826 38669 22363 30255 31105
22254 40564 22645 22532 6134 9176 39998 23892 8937 15608 16854 31009
8037 40401 13550 19526 41902 28782 13304 32796 24679 27140 45980 10021
40540 44498 13911 22435 32701 18405 39929 25521 12497 9851 39223 34823
15233 45333 5041 44979 45710 42150 19416 1892 23121 15860 8832 10308
10468 44296 3611 1480 37581 32254 13817 6883 32892 40258 46538 11940
6705 21634 28150 43757 895 6547 20970 28914 30117 25736 41734 11392
22002 5739 27210 27828 34192 37992 10915 6998 3824 42130 4494 35739
8515 1191 13642 30950 25943 12673 16726 34261 31828 3340 8747 39225
18979 17058 43130 4246 4793 44030 19454 29511 47929 15174 24333 19354
16694 8381 29642 46516 32224 26344 9405 18292 12437 27316 35466 41992
15642 5871 46489 26723 23396 7257 8974 3156 37420 44823 35423 13541
42858 32008 41282 38773 26570 2702 27260 46974 1469 20887 27426 38553
22152 24261 8297
19347 9978 27802
34991 6354 33561
29782 30875 29523
9278 48512 14349
38061 4165 43878
8548 33172 34410
22535 28811 23950
20439 4027 24186
38618 8187 30947
35538 43880 21459
7091 45616 15063
5505 9315 21908
36046 32914 11836
7304 39782 33721
16905 29962 12980
11171 23709 22460
34541 9937 44500
14035 47316 8815
15057 45482 24461
30518 36877 879
7583 13364 24332
448 27056 4682
12083 31378 21670
1159 18031 2221
17028 38715 9350
17343 24530 29574

TABLE 2-continued

Address of Parity Bit Accumulators (Rate 1/4)

46128 31039 32818
20373 36967 18345
46685 20622 32806

TABLE 3

Address of Parity Bit Accumulators (Rate 2/3)

31413 18834 28884 947 23050 14484 14809 4968 455 33659 16666 19008
13172 19939 13354 13719 6132 20086 34040 13442 27958 16813 29619 16553
1499 32075 14962 11578 11204 9217 10485 23062 30936 17892 24204 24885
32490 18086 18007 4957 7285 32073 19038 7152 12486 13483 24808 21759
32321 10839 15620 33521 23030 10646 26236 19744 21713 36784 8016 12869
35597 11129 17948 26160 14729 31943 20416 10000 7882 31380 27858 33356
14125 12131 36199 4058 35992 36594 33698 15475 1566 18498 12725 7067
17406 8372 35437 2888 1184 30068 25802 11056 5507 26313 32205 37232
15254 5365 17308 22519 35009 718 5240 16778 23131 24092 20587 33385
27455 17602 4590 21767 22266 27357 30400 8732 5596 3060 33703 3596
6882 873 10997 24738 20770 10067 13379 27409 25463 2673 6998 31378
15181 13645 34501 3393 3840 35227 15562 23615 38342 12139 19471 15483
13350 6707 23709 37204 25778 21082 7511 14588 10010 21854 28375 33591
12514 4695 37190 21379 18723 5802 7182 2529 29936 35860 28338 10835
34283 25610 33026 31017 21259 2165 21807 37578 1175 16710 21939 30841
27292 33730 6836 26476 27539 35784 18245 16394 17939 23094 19216 17432
11655 6183 38708 28408 35157 17089 13998 36029 15052 16617 5638 36464
15693 28923 26245 9432 11675 25720 26405 5838 31851 26898 8090 37037
24418 27583 7959 35562 37771 17784 11382 11156 37855 7073 21685 34515
10977 13633 30969 7516 11943 18199 5231 13825 19589 23661 11150 35602
19124 30774 6670 37344 16510 26317 23518 22957 6348 34069 8845 20175
34985 14441 25668 4116 3019 21049 37308 24551 24727 20104 24850 12114
38187 28527 13108 13985 1425 21477 30807 8613 26241 33368 35913 32477
5903 34390 24641 26556 23007 27305 38247 2621 9122 32806 21554 18685
17287 27292 19033
25796 31795 12152
12184 35088 31226
38263 33386 24892
23114 37995 29796
34336 10551 36245
35407 175 7203
14654 38201 22605
28404 6595 1018
19932 3524 29305
31749 20247 8128
18026 36357 26735
7543 29767 13588
13333 25965 8463
14504 36796 19710
4528 25299 7318
35091 25550 14798
7824 215 1248
30848 5362 17291
28932 30249 27073
13062 2103 16206
7129 32062 19612
9512 21936 38833
35849 33754 23450
18705 28656 18111
22749 27456 32187
28229 31684 30160
15293 8483 28002
14880 13334 12584
28646 2558 19687
6259 4499 26336
11952 28386 8405
10609 961 7582
10423 13191 26818
15922 36654 21450
10492 1532 1205
30551 36482 22153
5156 11330 34243
28616 35369 13322
8962 1485 21186
23541 17445 35561
33133 11593 19895

TABLE 3-continued

Address of Parity Bit Accumulators (Rate 2/3)

33917 7863 33651
20063 28331 10702
13195 21107 21859
4364 31137 4804
5585 2037 4830
30672 16927 14800

After all of the information bits are exhausted, the final parity bits are obtained as follows. First, the following operations are performed, starting with i=1

$$p_i = p_i \oplus p_{i-1}, i=1, 2, \ldots, n_{ldpc} - k_{ldpc} - 1.$$

Final content of $p_i$, i=0, 1, ..., $n_{ldpc} - k_{ldpc} - 1$ is equal to the parity bit $p_i$.

After all of the information bits are exhausted, the final parity bits are obtained as follows. First, the following operations are performed, starting with i=1

$$p_i = p_i \oplus p_{i-1}, i=1, 2, \ldots, n_{ldpc} - k_{ldpc} - 1.$$

Final content of $p_i$, i=0, 1, ..., $n_{ldpc} - k_{ldpc} - 1$ is equal to the parity bit $p_i$.

As regards BCH encoding, according to one embodiment of the present invention, the generator polynomial of the BCH code utilized by the BCH encoder 211 is as follows:

$$g(x) = (1 + x + x^3 + x^5 + x^{14}) \times (1 + x^6 + x^8 + x^{11} + x^{14}) \times$$
$$(1 + x + x^2 + x^6 + x^9 + x^{10} + x^{14}) \times (1 + x^4 + x^7 + x^8 + x^{10} + x^{12} + x^{14}) \times$$
$$(1 + x^2 + x^4 + x^6 + x^8 + x^9 + x^{11} + x^{13} + x^{14}) \times$$
$$(1 + x^3 + x^7 + x^8 + x^9 + x^{13} + x^{14}) \times$$
$$(1 + x^2 + x^5 + x^6 + x^7 + x^{10} + x^{11} + x^{13} + x^{14}) \times$$
$$(1 + x^5 + x^8 + x^9 + x^{10} + x^{11} + x^{14}) \times (1 + x + x^2 + x^3 + x^9 + x^{10} + x^{14}) \times$$
$$(1 + x^3 + x^6 + x^9 + x^{11} + x^{12} + x^{14}) \times (1 + x^4 + x^{11} + x^{12} + x^{14}) \times$$
$$(1 + x + x^2 + x^3 + x^5 + x^6 + x^7 + x^8 + x^{10} + x^{13} + x^{14}).$$

BCH encoding of information bits $m = (m_{k_{bch}-1}, m_{k_{bch}-2}, \ldots, m_1, m_0)$ onto a codeword $c = (m_{k_{bch}-1}, m_{k_{bch}-2}, \ldots, m_1, m_0, d_{n_{bch}-k_{bch}-1}, d_{n_{bch}-k_{bch}-2}, \ldots, d_1, d_0)$ is achieved as follows. The message polynomial $m(x) = m_{k_{bch}-1} x^{k_{bch}-1} + m_{k_{bch}-2} x^{k_{bch}-2} + \ldots + m_1 x + m_0$ is multiplied by $x^{n_{bch}-k_{bch}}$. Next, $x^{n_{bch}-k_{bch}} m(x)$ divided by $g(x)$. With $d(x) = d_{n_{bch}-k_{bch}-1} x^{n_{bch}-k_{bch}-1} + \ldots + d_1 x + d_0$ as the remainder, the codeword polynomial is set as follows: $c(x) = x^{n_{bch}-k_{bch}} m(x) + d(x)$.

As discussed, $k_{ldpc}$ bits are systematically encoded to generate $n_{ldpc}$ bits. According to one embodiment of the present invention, $n_{ldpc}$ is 16200 bits, which is a short block length. Given the relatively short length of such codes, LDPC codes having approximate lengths of 16200 bits or less are deemed "short" block length codes.

Figure 2D:
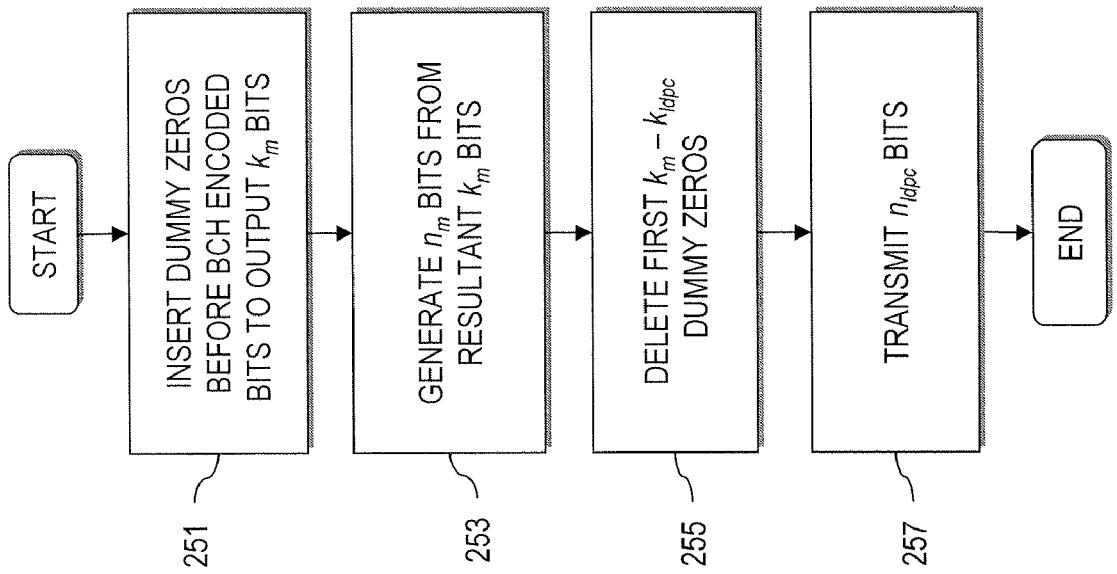

In accordance with an embodiment of the present invention, some of the short blocks codes (e.g., rate 1/5 of Table 5) are generated by shortening versions of slightly longer ($k_m$, $n_m$) "mother" codes of block size $n_m > 16200$. As shown in FIG. 2D, $k_{ldpc}$ of the BCH encoded bits are preceded by $k_m - k_{ldpc}$ dummy zeros (per step 251). The resulting $k_m$ bits are systematically encoded to generate $n_m$ bits, as in step 253. The first $k_m - k_{ldpc}$ dummy zeros are then deleted, as in step 255, and the resulting $n_{ldpc}$=16200 bits will be transmitted (step 257). It is noted that $k_m - k_{ldpc} = n_m - n_{ldpc}$. Tables 4-6 provide other exemplary short code rates, 1/3, 1/5 and 2/5 ($n_{ldpc}$ of 16200 bits):

TABLE 4

Address of Parity Bit Accumulators (Rate 1/3)

416 8909 4156 3216 3112 2560 2912 6405 8593 4969 6723 6912
8978 3011 4339 9312 6396 2957 7288 5485 6031 10218 2226 3575
3383 10059 1114 10008 10147 9384 4290 434 5139 3536 1965 2291
2797 3693 7615 7077 743 1941 8716 6215 3840 5140 4582 5420
6110 8551 1515 7404 4879 4946 5383 1831 3441 9569 10472 4306
1505 5682 7778
7172 6830 6623
7281 3941 3505
10270 8669 914
3622 7563 9388
9930 5058 4554
4844 9609 2707
6883 3237 1714
4768 3878 10017
10127 3334 8267

TABLE 5

Address of Parity Bit Accumulators (Rate 1/5: Shortened from Rate 1/4)

6295 9626 304 7695 4839 4936 1660 144 11203 5567 6347 12557
10691 4988 3859 3734 3071 3494 7687 10313 5964 8069 8296 11090
10774 3613 5208 11177 7676 3549 8746 6583 7239 12265 2674 4292
11869 3708 5981 8718 4908 10650 6805 3334 2627 10461 9285 11120
7844 3079 10773
3385 10854 5747
1360 12010 12202
6189 4241 2343
9840 12726 4977

TABLE 6

Address of Parity Bit Accumulators (Rate 2/5)

5650 4143 8750 583 6720 8071 635 1767 1344 6922 738 6658
5696 1685 3207 415 7019 5023 5608 2605 857 6915 1770 8016
3992 771 2190 7258 8970 7792 1802 1866 6137 8841 886 1931
4108 3781 7577 6810 9322 8226 5396 5867 4428 8827 7766 2254
4247 888 4367 8821 9660 324 5864 4774 227 7889 6405 8963
9693 500 2520 2227 1811 9330 1928 5140 4030 4824 806 3134
1652 8171 1435
3366 6543 3745
9286 8509 4645
7397 5790 8972
6597 4422 1799
9276 4041 3847
8683 7378 4946
5348 1993 9186
6724 9015 5646
4502 4439 8474
5107 7342 9442
1387 8910 2660

The above approach to designing LDPC codes, as provided in Tables 1-6, advantageously permits storage and retrieval of relevant information regarding partitioned groups of bit nodes and check nodes to be always placed in contiguous memory locations within memory (e.g., Random Access Memory (RAM)). Consequently, multiple code rates can be supported without employing different decoders. Further, the design enables use of a single RAM bank, thereby minimizing size of the integrated circuit. As mentioned, the above LDPC codes, in an exemplary embodiment, can be used to variety of digital video applications, such as MPEG (Motion Pictures Expert Group) packet transmission.

Figure 3:
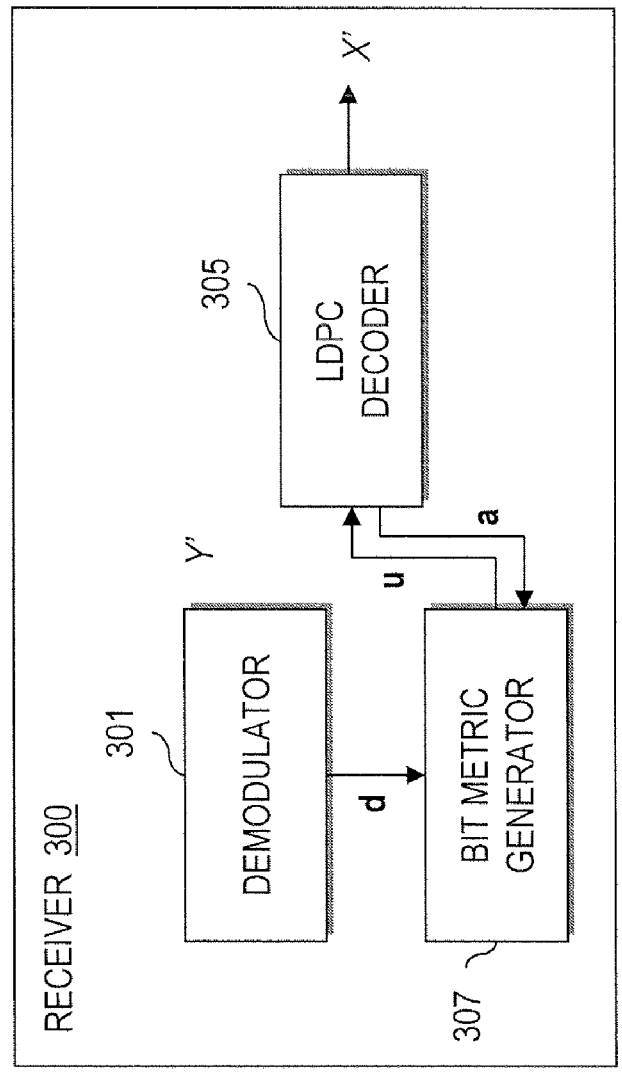
FIG. 3 is a diagram of an exemplary receiver in the system of FIG. 1.

FIG. 3 is a diagram of an exemplary receiver in the system of FIG. 1. At the receiving side, a receiver 300 includes a demodulator 301 that performs demodulation of received signals from transmitter 200. These signals are received at a receive antenna 303 for demodulation. After demodulation, the received signals are forwarded to a LDPC decoder 305, which attempts to reconstruct the original source messages by generating messages, X', in conjunction with a bit metric generator 307. The bit metric generator 307 may exchange information with the decoder 305 back and forth (iteratively) during the decoding process. These decoding approaches are more fully described in co-pending application, entitled "Method and System for Routing in Low Density Parity Check (LDPC) Decoders," filed Jul. 3, 2003 (Ser. No. 10/613, 824), which is incorporated herein in its entirety. It is noted that LDPC codes, as constructed per Tables 1-6, can support multiple code rates (consequently, multiple data rates) using a common decoding architecture; in contrast, convolutional codes, for example, require puncturing techniques to achieve intermediate rates.

Figures 4, 5, 6:
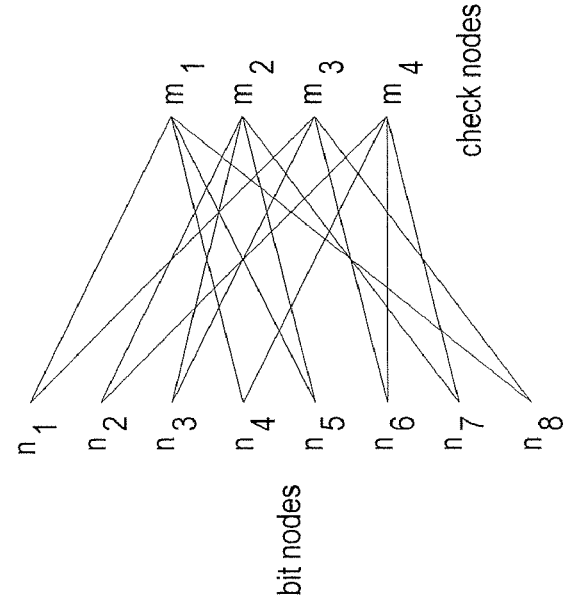
FIG. 4 is a diagram of a sparse parity check matrix, in accordance with an embodiment of the present invention.
FIG. 5 is a diagram of a bipartite graph of an LDPC code of the matrix of FIG. 4.
FIG. 6 is a diagram of a sub-matrix of a sparse parity check matrix, wherein the sub-matrix contains parity check values restricted to the lower triangular region, according to an embodiment of the present invention.

To further appreciate the advantages offered by the present invention, it is instructive to examine how LDPC codes are generated, as discussed in FIG. 4.

FIG. 4 is a diagram of a sparse parity check matrix, in accordance with an embodiment of the present invention. LDPC codes are long, linear block codes with sparse parity check matrix $H_{(n-k) \times n}$. Typically the block length, n, ranges from thousands to tens of thousands of bits. For example, a parity check matrix for an LDPC code of length n=8 and rate 1/2 is shown in FIG. 4. The same code can be equivalently represented by the bipartite graph, per FIG. 5.

FIG. 5 is a diagram of a bipartite graph of an LDPC code of the matrix of FIG. 4. Parity check equations imply that for each check node, the sum (over GF (Galois Field)(2)) of all adjacent bit nodes is equal to zero. As seen in the figure, bit nodes occupy the left side of the graph and are associated with one or more check nodes, according to a predetermined relationship. For example, corresponding to check node $m_1$, the following expression exists $n_1+n_4+n_5+n_8=0$ with respect to the bit nodes.

Returning to the receiver 300, the LDPC decoder 305 is considered a message passing decoder, whereby the decoder 305 aims to find the values of bit nodes. To accomplish this task, bit nodes and check nodes iteratively communicate with each other. The nature of this communication is described below.

From check nodes to bit nodes, each check node provides to an adjacent bit node an estimate ("opinion") regarding the value of that bit node based on the information coming from other adjacent bit nodes. For instance, in the above example if the sum of $n_4$, $n_5$ and $n_8$ "looks like" 0 to $m_1$, then $m_1$ would indicate to $n_1$ that the value of $n_1$ is believed to be 0 (since $n_1+n_4+n_5+n_8=0$); otherwise $m_1$ indicate to $n_1$ that the value of $n_1$ is believed to be 1. Additionally, for soft decision decoding, a reliability measure is added.

From bit nodes to check nodes, each bit node relays to an adjacent check node an estimate about its own value based on the feedback coming from its other adjacent check nodes. In the above example $n_1$ has only two adjacent check nodes $m_1$ and $m_3$. If the feedback coming from $m_3$ to $n_1$ indicates that the value of $n_1$ is probably 0, then $n_1$ would notify $m_1$ that an estimate of $n_1$'s own value is 0. For the case in which the bit node has more than two adjacent check nodes, the bit node performs a majority vote (soft decision) on the feedback coming from its other adjacent check nodes before reporting that decision to the check node it communicates. The above process is repeated until all bit nodes are considered to be correct (i.e., all parity check equations are satisfied) or until a predetermined maximum number of iterations is reached, whereby a decoding failure is declared.

FIG. 6 is a diagram of a sub-matrix of a sparse parity check matrix, wherein the sub-matrix contains parity check values restricted to the lower triangular region, according to an embodiment of the present invention. As described previously, the encoder 203 (of FIGS. 2A and 2B) can employ a simple encoding technique by restricting the values of the lower triangular area of the parity check matrix. According to an embodiment of the present invention, the restriction imposed on the parity check matrix is of the form:

$$H_{(n-k) \times n} = [A_{(n-k) \times k} B_{(n-k) \times (n-k)}],$$

where B is lower triangular.

Any information block $i=(i_0, i_1, \ldots, i_{k-1})$ is encoded to a codeword $c=(i_0, i_1, \ldots, i_{k-1}, p_0, p_1, \ldots, p_{n-k-1})$ using $Hc^T=0$, and recursively solving for parity bits; for example, $$a_{00}i_0+a_{01}i_1+\ldots+a_{0,k-1}i_{k-1}+p_0=0 \Rightarrow \text{Solve } p_0$$

$$a_{10}i_0+a_{11}i_1+\ldots+a_{1,k-1}i_{k-1}+b_{10}p_0+p_1=0 \Rightarrow \text{Solve } p_1$$

and similarly for $_2, p_3, \ldots, p_{n-k-1}$.

Figure 7:
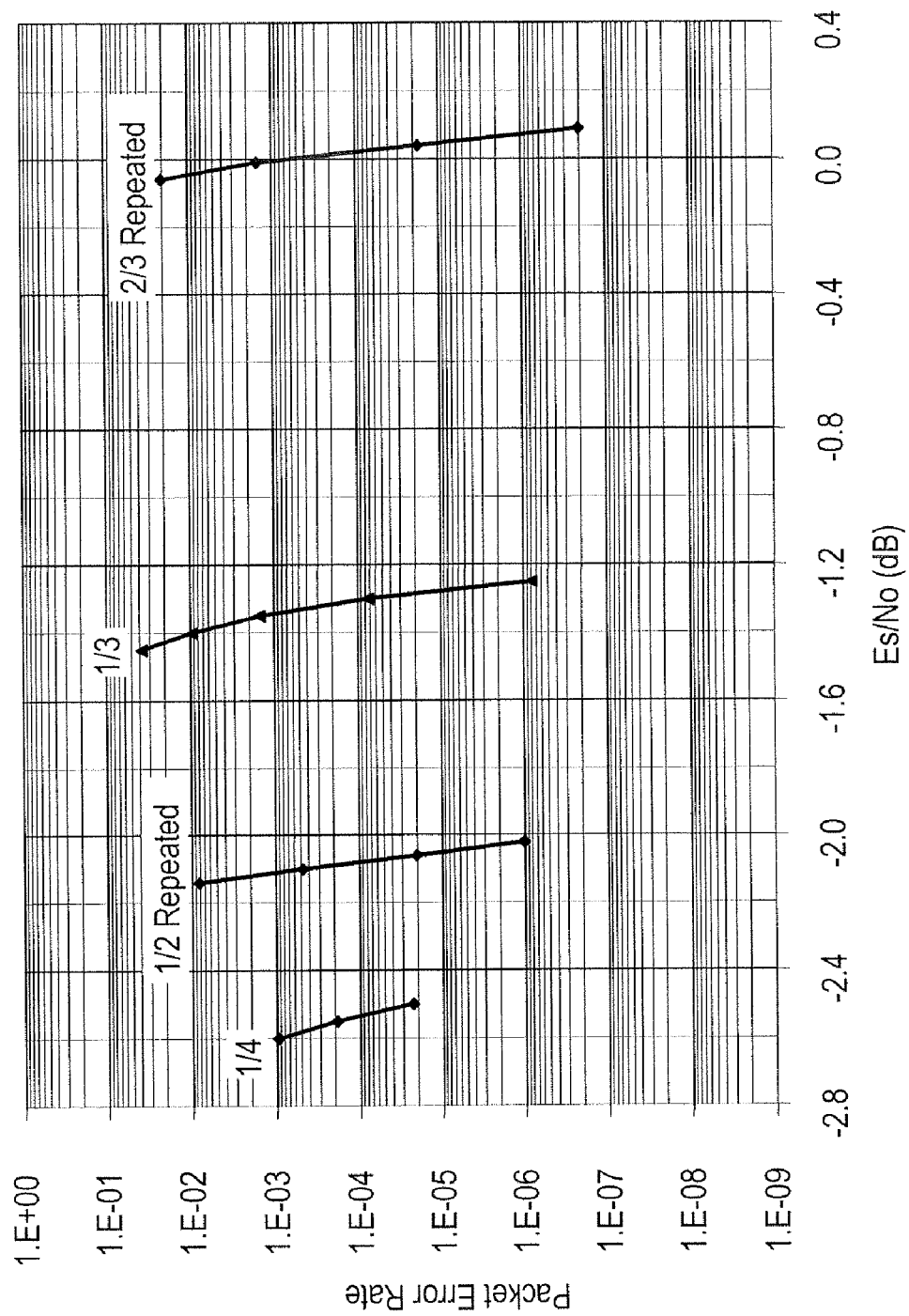
FIG. 7 is a graph of performance of the LDPC codes at rates 1/3 and 1/4 versus repetition codes.
Figure 8:
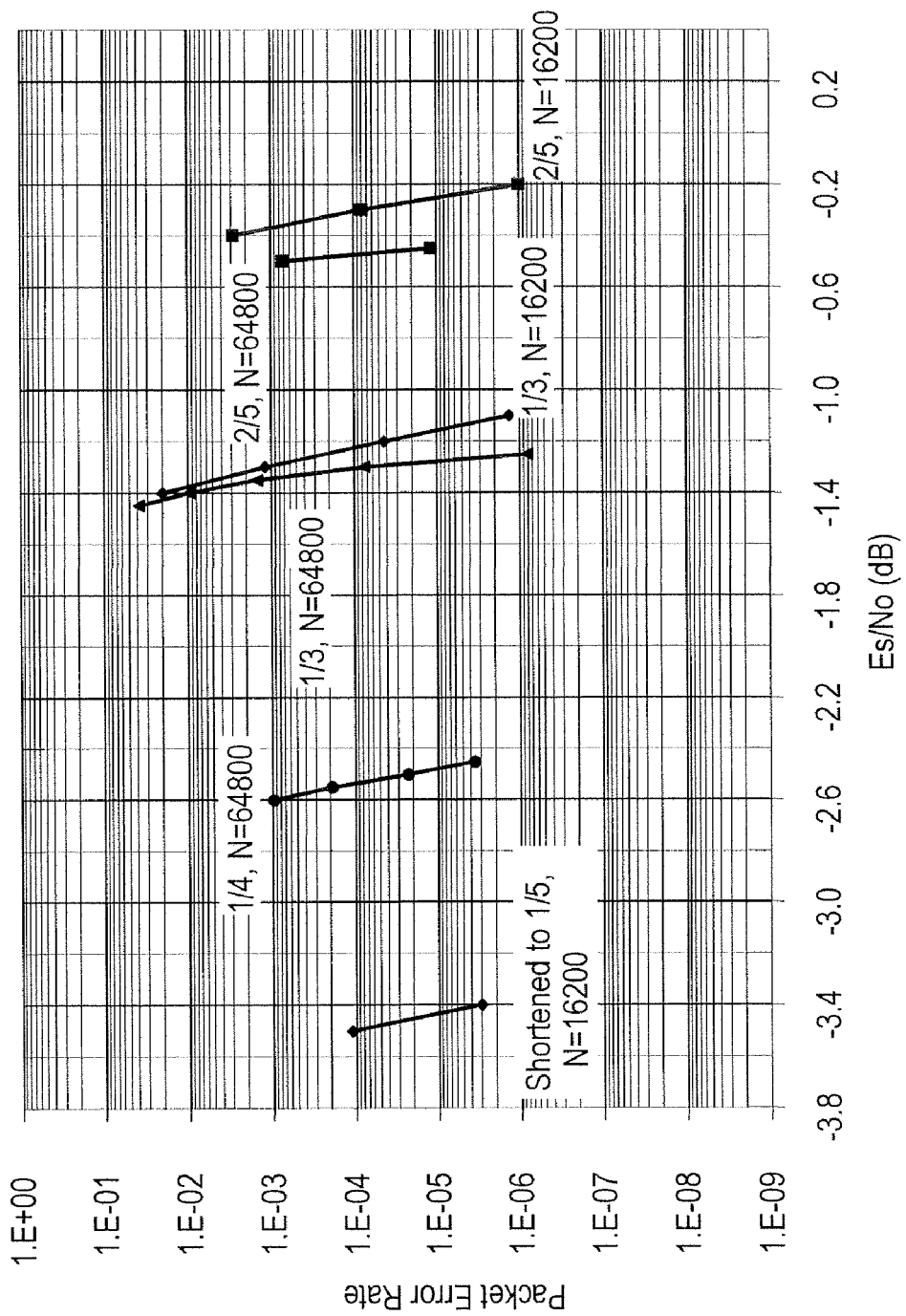
FIG. 8 is a graph of performance of the LDPC codes at the various code rates and modulation schemes supported by the transmitter of FIG. 2A.

FIGS. 7 and 8 are graphs of performance of the LDPC codes at the various code rates and modulation schemes supported by the transmitter 200 of FIG. 2A. Specifically, the graph of FIG. 7 shows a performance comparison between rate 1/3 and 1/4 LDPC codes and repetition rate 2/3 and repetition rate 1/2 LDPC codes, respectively. Under this scenario, performance is considered in the case of rate 1/3 and 1/4 for QPSK LDPC codes on an Additive White Gaussian Noise (AWGN) channel. As seen, the rate 1/3 code offers about 1.3 dB gain with respect to a repetition rate 2/3 LDPC code, whereas rate 1/4 LDPC code offers about 0.4 dB gain with respect to a repetition rate 1/2 LDPC code. Repetition codes are constructed by repeating the source information bits as the set of parity bits. Therefore rate 1/3 and 1/4 LDPC codes would offer performance advantage with respect to repetition codes when used in low priority branch of backward compatible hierarchical modulation schemes.

FIG. 8 illustrates the performance of short frame length codes of rates 1/5, 1/3 and 2/5 along with the long frame length codes of rates 1/4, 1/3 and 2/5. As shown, the short codes for rates 1/3 and 2/5 exhibit nearly comparable performance to their counterpart long codes (within 0.2 dB).

The LDPC encoding processes as detailed above can be executed through a variety of hardware and/or software configurations. In fact, this approach also can be readily deployed solely through a software change, thereby eliminating costly hardware modifications.

Figure 9:
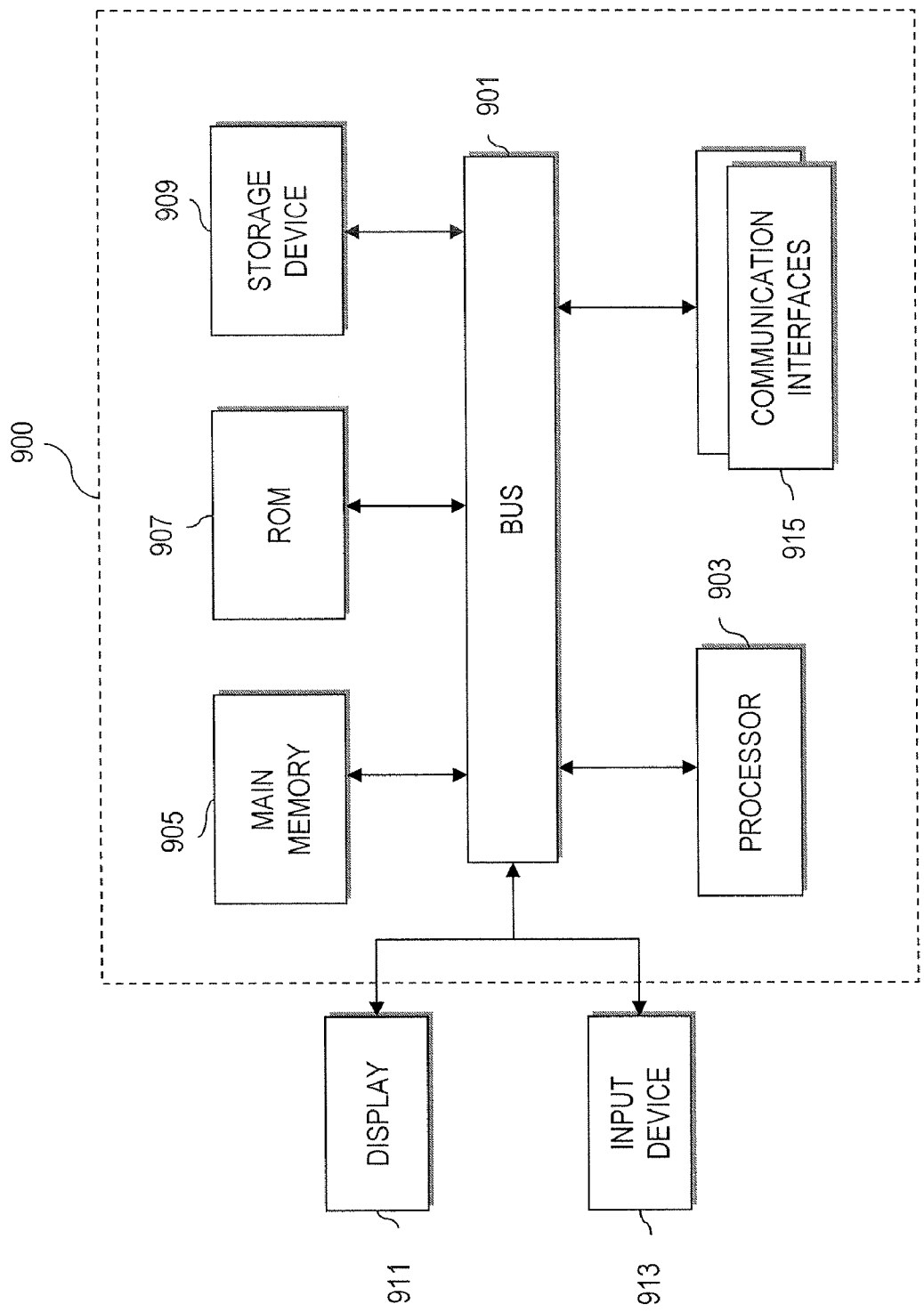
FIG. 9 is a diagram of a computing system that can perform the LDPC encoding process, in accordance with embodiments of the present invention.

FIG. 9 illustrates exemplary hardware upon which an embodiment according to the present invention can be implemented. A computing system 900 includes a bus 901 or other communication mechanism for communicating information and a processor 903 coupled to the bus 901 for processing information. The computing system 900 also includes main memory 905, such as a random access memory (RAM) or other dynamic storage device, coupled to the bus 901 for storing information and instructions to be executed by the processor 903. Main memory 905 can also be used for storing temporary variables or other intermediate information during execution of instructions by the processor 903. The computing system 900 may further include a read only memory (ROM) 907 or other static storage device coupled to the bus 901 for storing static information and instructions for the processor 903. A storage device 909, such as a magnetic disk or optical disk, is coupled to the bus 901 for persistently storing information and instructions.

The computing system 900 may be coupled via the bus 901 to a display 911, such as a liquid crystal display, or active matrix display, for displaying information to a user. An input device 913, such as a keyboard including alphanumeric and other keys, may be coupled to the bus 901 for communicating information and command selections to the processor 903. The input device 913 can include a cursor control, such as a mouse, a trackball, or cursor direction keys, for communicating direction information and command selections to the processor 903 and for controlling cursor movement on the display 911.

According to one embodiment of the invention, the processes of FIGS. 2C and 2D can be provided by the computing system 900 in response to the processor 903 executing an arrangement of instructions contained in main memory 905. Such instructions can be read into main memory 905 from another computer-readable medium, such as the storage device 909. Execution of the arrangement of instructions contained in main memory 905 causes the processor 903 to perform the process steps described herein. One or more processors in a multi-processing arrangement may also be employed to execute the instructions contained in main memory 905. In alternative embodiments, hard-wired circuitry may be used in place of or in combination with software instructions to implement the embodiment of the present invention. In another example, reconfigurable hardware such as Field Programmable Gate Arrays (FPGAs) can be used, in which the functionality and connection topology of its logic gates are customizable at run-time, typically by programming memory look up tables. Thus, embodiments of the present invention are not limited to any specific combination of hardware circuitry and software.

The computing system 900 also includes at least one communication interface 915 coupled to bus 901. The communication interface 915 provides a two-way data communication coupling to a network link (not shown). The communication interface 915 sends and receives electrical, electromagnetic, or optical signals that carry digital data streams representing various types of information. Further, the communication interface 915 can include peripheral interface devices, such as a Universal Serial Bus (USB) interface, a PCMCIA (Personal Computer Memory Card International Association) interface, etc.

The processor 903 may execute code that is being received over the communication interface 915 and/or store the code in the storage device 909, or other non-volatile storage for later execution. In this manner, the computing system 900 may obtain application code in the form of a carrier wave.

The term "computer-readable medium" as used herein refers to any medium that participates in providing instructions to the processor 903 for execution. Such a medium may take many forms, including but not limited to non-volatile media, volatile media, and transmission media. Non-volatile media include, for example, optical or magnetic disks, such as the storage device 909. Volatile media include dynamic memory, such as main memory 905. Transmission media include coaxial cables, copper wire and fiber optics, including the wires that comprise the bus 901. Transmission media can also take the form of acoustic, optical, or electromagnetic waves, such as those generated during radio frequency (RF) and infrared (IR) data communications. Common forms of computer-readable media include, for example, a floppy disk, a flexible disk, hard disk, magnetic tape, any other magnetic medium, a CD-ROM, CDRW, DVD, any other optical medium, punch cards, paper tape, optical mark sheets, any other physical medium with patterns of holes or other optically recognizable indicia, a RAM, a PROM, and EPROM, a FLASH-EPROM, any other memory chip or cartridge, a carrier wave, or any other medium from which a computer can read.

Various forms of computer-readable media may be involved in providing instructions to a processor for execution. For example, the instructions for carrying out at least part of the present invention may initially be borne on a magnetic disk of a remote computer. In such a scenario, the remote computer loads the instructions into main memory and sends the instructions over a telephone line using a modem. A modem of a local system receives the data on the telephone line and uses an infrared transmitter to convert the data to an infrared signal and transmit the infrared signal to a portable computing device, such as a personal digital assistant (PDA) or a laptop. An infrared detector on the portable computing device receives the information and instructions borne by the infrared signal and places the data on a bus. The bus conveys the data to main memory, from which a processor retrieves and executes the instructions. The instructions received by main memory can optionally be stored on storage device either before or after execution by processor.

Accordingly, the various embodiments of the present invention provide an LDPC encoder generates a LDPC code having an outer Bose Chaudhuri Hocquenghem (BCH) code according to one of Tables 1-6 for transmission as a LDPC coded signal. Each of the Tables 1-6 specifies the address of parity bit accumulators. The above approach advantageously yields reduced complexity without sacrificing performance.

While the present invention has been described in connection with a number of embodiments and implementations, the present invention is not so limited but covers various obvious modifications and equivalent arrangements, which fall within the purview of the appended claims.

What is claimed is:

1. A method comprising:
decoding an Low Density Parity Check (LDPC) coded signal by accessing edge values to satisfy parity check equations relating to LPDC codes having one of a code rate of 1/3, a code rate of 1/4, or a code rate of 2/5 associated with respective tables each specifying address of parity bit accumulators,

---

Address of Parity Bit Accumulators (Rate 1/3)

34903 20927 32093 1052 25611 16093 16454 5520 506 37399 18518
21120 11636 14594 22158 14763 15333 6838 22222 37856 14985
31041 18704 32910 17449 1665 35639 16624 12867 12449 10241
11650 25622 34372 19878 26894 29235 19780 36056 20129 20029
5457 8157 35554 21237 7943 13873 14980 9912 7143 35911 12043
17360 37253 25588 11827 29152 21936 24125 40870 40701 36035
39556 12366 19946 29072 16365 35495 22686 11106 8756 34863
19165 15702 13536 40238 4465 40034 40590 37540 17162 1712 20577

| Address of Parity Bit Accumulators (Rate 1/3) |
| --- |
| 14138 31338 19342 9301 39375 3211 1316 33409 28670 12282 6118 |
| 29236 35787 11504 30506 19558 5100 24188 24738 30397 33775 9699 |
| 6215 3397 37451 34689 23126 7571 1058 12127 27518 23064 11265 |
| 14867 30451 28289 2966 11660 15334 16867 15160 38343 3778 4265 |
| 39139 17293 26229 42604 13486 31497 1365 14828 7453 26350 41346 |
| 28643 23421 8354 16255 11055 24279 15687 12467 13906 5215 41328 |
| 23755 20800 6447 7970 2803 33262 39843 5363 22469 38091 28457 |
| 36696 34471 23619 2404 24229 41754 1297 18563 3673 39070 14480 |
| 30279 37483 7580 29519 30519 39831 20252 18132 20010 34386 7252 |
| 27526 12950 6875 43020 31566 39069 18985 15541 40020 16715 1721 |
| 37332 39953 17430 32134 29162 10490 12971 28581 29331 6489 35383 |
| 736 7022 42349 8783 6767 11871 21675 10325 11548 25978 431 24085 |
| 1925 10602 28585 12170 15156 34404 8351 13273 20208 5800 15367 |
| 21764 16279 37832 34792 21250 34192 7406 41488 18346 29227 |
| 26127 25493 7048 |
| 39948 28229 24899 |
| 17408 14274 38993 |
| 38774 15968 28459 |
| 41404 27249 27425 |
| 41229 6082 43114 |
| 13957 4979 40654 |
| 3093 3438 34992 |
| 34082 6172 28760 |
| 42210 34141 41021 |
| 14705 17783 10134 |
| 41755 39884 22773 |
| 14615 15593 1642 |
| 29111 37061 39860 |
| 9579 33552 633 |
| 12951 21137 39608 |
| 38244 27361 29417 |
| 2939 10172 36479 |
| 29094 5357 19224 |
| 9562 24436 28637 |
| 40177 2326 13504 |
| 6834 21583 42516 |
| 40651 42810 25709 |
| 31557 32138 38142 |
| 18624 41867 39296 |
| 37560 14295 16245 |
| 6821 21679 31570 |
| 25339 25083 22081 |
| 8047 697 35268 |
| 9884 17073 19995 |
| 26848 35245 8390 |
| 18658 16134 14807 |
| 12201 32944 5035 |
| 25236 1216 38986 |
| 42994 24782 8681 |
| 28321 4932 34249 |
| 4107 29382 32124 |
| 22157 2624 14468 |
| 38788 27081 7936 |
| 4368 26148 10578 |
| 25353 4122 39751 |

| Address of Parity Bit Accumulators (Rate 1/4) |
| --- |
| 23606 36098 1140 28859 18148 18510 6226 540 42014 20879 23802 |
| 47088 16419 24928 16609 17248 7693 24997 42587 16858 34921 21042 |
| 37024 20692 1874 40094 18704 14474 14004 11519 13106 28826 38669 |
| 22363 30255 31105 22254 40564 22645 22532 6134 9176 39998 23892 |
| 8937 15608 16854 31009 8037 40401 13550 19526 41902 28782 13304 |
| 32796 24679 27140 45980 10021 40540 44498 13911 22435 32701 |
| 18405 39929 25521 12497 9851 39223 34823 15233 45333 5041 44979 |
| 45710 42150 19416 1892 23121 15860 8832 10308 10468 44296 3611 |
| 1480 37581 32254 13817 6883 32892 40258 46538 11940 6705 21634 |
| 28150 43757 895 6547 20970 28914 30117 25736 41734 11392 22002 |
| 5739 27210 27828 34192 37992 10915 6998 3824 42130 4494 45739 |
| 8515 1191 13642 30950 25943 12673 16726 34261 31828 3340 8747 |
| 39225 18979 17058 43130 4246 4793 44030 19454 29511 47929 15174 |
| 24333 19354 16694 8381 29642 46516 32224 26344 9405 18292 12437 |

| Address of Parity Bit Accumulators (Rate 1/4) |
| --- |
| 27316 35466 41992 15642 5871 46489 26723 23396 7257 8974 3156 |
| 37420 44823 35423 13541 42858 32008 41282 38773 26570 2702 27260 |
| 46974 1469 20887 27426 38553 |
| 22152 24261 8297 |
| 19347 9978 27802 |
| 34991 6354 33561 |
| 29782 30875 29523 |
| 9278 48512 14349 |
| 38061 4165 43878 |
| 8548 33172 34410 |
| 22535 28811 23950 |
| 20439 4027 24186 |
| 38618 8187 30947 |
| 35538 43880 21459 |
| 7091 45616 15063 |
| 5505 9315 21908 |
| 36046 32914 11836 |
| 7304 39782 33721 |
| 16905 29962 12980 |
| 11171 23709 22460 |
| 34541 9937 44500 |
| 14035 47316 8815 |
| 15057 45482 24461 |
| 30518 36877 879 |
| 7583 13364 24332 |
| 448 27056 4682 |
| 12083 31378 21670 |
| 1159 18031 2221 |
| 17028 38715 9350 |
| 17343 24530 29574 |
| 46128 31039 32818 |
| 20373 36967 18345 |
| 46685 20622 32806 |

| Address of Parity Bit Accumulators (Rate 2/5) |
| --- |
| 5650 4143 8750 583 6720 8071 635 1767 1344 6922 738 6658 |
| 5696 1685 3207 415 7019 5023 5608 2605 857 6915 1770 8016 |
| 3992 771 2190 7258 8970 7792 1802 1866 6137 8841 886 1931 |
| 4108 3781 7577 6810 9322 8226 5396 5867 4428 8827 7766 2254 |
| 4247 888 4367 8821 9660 324 5864 4774 227 7889 6405 8963 |
| 9693 500 2520 2227 1811 9330 1928 5140 4030 4824 806 3134 |
| 1652 8171 1435 |
| 3366 6543 3745 |
| 9286 8509 4645 |
| 7397 5790 8972 |
| 6597 4422 1799 |
| 9276 4041 3847 |
| 8683 7378 4946 |
| 5348 1993 9186 |
| 6724 9015 5646 |
| 4502 4439 8474 |
| 5107 7342 9442 |
| 1387 8910 2660. |

2. The method according to claim 1, wherein the coded signal includes an 8-bit cyclic redundancy check (CRC) code with generator polynomial $(x^5+x^4+x^3+x^2+1)(x^2+x+1)(x+1)$.

3. The method according to claim 1, wherein the coded signal further includes an outer code that is based on Bose Chaudhuri Hocquenghem (BCH) codes.

4. The method according to claim 3, wherein information bits are accumulated at parity bit addresses according to $\{x+m \bmod 360 \times q\} \bmod(n_{ldpc}-k_{ldpc})$, where $n_{ldpc}$ is the codeword size, $k_{ldpc}$ is the information block size, m is an integer corresponding to a particular information bit, q is the code rate, and x denotes the address of the parity bit accumulator as specified by the respective tables.

5. The method according to claim 4, wherein, for the 1/3 rate code, q=120, $n_{ldpc}$=64800, $k_{ldpc}$=$n_{BCH}$=21600, $k_{BCH}$=21408 (12 bit error correcting BCH).

6. The method according to claim 4, wherein, for the 1/4 rate code, q-135, $n_{ldpc}$=64800, $k_{ldpc}$=$n_{BCH}$=16200, $k_{BCH}$=16008 (12 bit error correcting BCH).

7. A method according to claim 4, wherein, for the 2/5 rate code, q=108, $n_{ldpc}$=64800, $k_{ldpc}$=$n_{BCH}$=25920, $k_{BCH}$=25728 (12 bit error correcting BCH).

8. The method according to claim 1, further comprising:
demodulating the LDPC coded signal according to one of 8-PSK (Phase Shift Keying), 16-QAM (Quadrature Amplitude Modulation), QPSK (Quadrature Phase Shift Keying), 16-APSK (Amplitude Phase Shift Keying) or 32-APSK.

9. An apparatus comprising:
logic configured to receive an Low Density Parity Check (LDPC) coded signal and to decode the signal by accessing edge values to satisfy parity check equations relating to LPDC codes having one of a code rate of 1/3, a code rate of 1/4, or a code rate of 2/5 associated with respective tables each specifying address of parity bit accumulators,

| Address of Parity Bit Accumulators (Rate 1/3) |
| --- |
| 34903 20927 32093 1052 25611 16093 16454 5520 506 37399 18518 21120 |
| 11636 14594 22158 14763 15333 6838 22222 37856 14985 31041 18704 32910 |
| 17449 1665 35639 16624 12867 12449 10241 11650 25622 34372 19878 26894 |
| 29235 19780 36056 20129 20029 5457 8157 35554 21237 7943 13873 14980 |
| 9912 7143 35911 12043 17360 37253 25588 11827 29152 21936 24125 40870 |
| 40701 36035 39556 12366 19946 29072 16365 35495 22686 11106 8756 34863 |
| 19165 15702 13536 40238 4465 40034 40590 37540 17162 1712 20577 14138 |
| 31338 19342 9301 39375 3211 1316 33409 28670 12282 6118 29236 35787 |
| 11504 30506 19558 5100 24188 24738 30397 33775 9699 6215 3397 37451 |
| 34689 23126 7571 1058 12127 27518 23064 11265 14867 30451 28289 2966 |
| 11660 15334 16867 15160 38343 3778 4265 39139 17293 26229 42604 13486 |
| 31497 1365 14828 7453 26350 41346 28643 23421 8354 16255 11055 24279 |
| 15687 12467 13906 5215 41328 23755 20800 6447 7970 2803 33262 39843 |
| 5363 22469 38091 28457 36696 34471 23619 2404 24229 41754 1297 18563 |
| 3673 39070 14480 30279 37483 7580 29519 30519 39831 20252 18132 20010 |
| 34386 7252 27526 12950 6875 43020 31566 39069 18985 15541 40020 16715 |
| 1721 37332 39953 17430 32134 29162 10490 12971 28581 29331 6489 35383 |
| 736 7022 42349 8783 6767 11871 21675 10325 11548 25978 431 24085 |
| 1925 10602 28585 12170 15156 34404 8351 13273 20208 5800 15367 21764 |
| 16279 37832 34792 21250 34192 7406 41488 18346 29227 26127 25493 7048 |
| 39948 28229 24899 |
| 17408 14274 38993 |
| 38774 15968 28459 |
| 41404 27249 27425 |
| 41229 6082 43114 |
| 13957 4979 40654 |
| 3093 3438 34992 |
| 34082 6172 28760 |
| 42210 34141 41021 |
| 14705 17783 10134 |
| 41755 39884 22773 |
| 14615 15593 1642 |
| 29111 37061 39860 |
| 9579 33552 633 |
| 12951 21137 39608 |
| 38244 27361 29417 |
| 2939 10172 36479 |
| 29094 5357 19224 |
| 9562 24436 28637 |
| 40177 2326 13504 |
| 6834 21583 42516 |
| 40651 42810 25709 |
| 31557 32138 38142 |
| 18624 41867 39296 |
| 37560 14295 16245 |
| 6821 21679 31570 |
| 25339 25083 22081 |
| 8047 697 35268 |
| 9884 17073 19995 |
| 26848 35245 8390 |
| 18658 16134 14807 |
| 12201 32944 5035 |
| 25236 1216 38986 |
| 42994 24782 8681 |
| 28321 4932 34249 |
| 4107 29382 32124 |
| 22157 2624 14468 |
| 38788 27081 7936 |
| 4368 26148 10578 |
| 25353 4122 39751 |

| Address of Parity Bit Accumulators (Rate ¼) |
| --- |
| 23606 36098 1140 28859 18148 18510 6226 540 42014 20879 23802 47088 |
| 16419 24928 16609 17248 7693 24997 42587 16858 34921 21042 37024 20692 |
| 1874 40094 18704 14474 14004 11519 13106 28826 38669 22363 30255 31105 |
| 22254 40564 22645 22532 6134 9176 39998 23892 8937 15608 16854 31009 |
| 8037 40401 13550 19526 41902 28782 13304 32796 24679 27140 45980 10021 |
| 40540 44498 13911 22435 32701 18405 39929 25521 12497 9851 39223 34823 |
| 15233 45333 5041 44979 45710 42150 19416 1892 23121 15860 8832 10308 |
| 10468 44296 3611 1480 37581 32254 13817 6883 32892 40258 46538 11940 |
| 6705 21634 28150 43757 895 6547 20970 28914 30117 25736 41734 11392 |
| 22002 5739 27210 27828 34192 37992 10915 6998 3824 42130 4494 35739 |
| 8515 1191 13642 30950 25943 12673 16726 34261 31828 3340 8747 39225 |
| 18979 17058 43130 4246 4793 44030 19454 29511 47929 15174 24333 19354 |
| 16694 8381 29642 46516 32224 26344 9405 18292 12437 27316 35466 41992 |
| 15642 5871 46489 26723 23396 7257 8974 3156 37420 44823 35423 13541 |
| 42858 32008 41282 38773 26570 2702 27260 46974 1469 20887 27426 38553 |
| 22152 24261 8297 |
| 19347 9978 27802 |
| 34991 6354 33561 |
| 29782 30875 29523 |
| 9278 48512 14349 |
| 38061 4165 43878 |
| 8548 33172 34410 |
| 22535 28811 23950 |
| 20439 4027 24186 |
| 38618 8187 30947 |
| 35538 43880 21459 |
| 7091 45616 15063 |
| 5505 9315 21908 |
| 36046 32914 11836 |
| 7304 39782 33721 |
| 16905 29962 12980 |
| 11171 23709 22460 |
| 34541 9937 44500 |
| 14035 47316 8815 |
| 15057 45482 24461 |
| 30518 36877 879 |
| 7583 13364 24332 |
| 448 27056 4682 |
| 12083 31378 21670 |
| 1159 18031 2221 |
| 17028 38715 9350 |
| 17343 24530 29574 |
| 46128 31039 32818 |
| 20373 36967 18345 |
| 46685 20622 32806 |

| Address of Parity Bit Accumulators (Rate ⅖) |
| --- |
| 5650 4143 8750 583 6720 8071 635 1767 1344 6922 738 6658 |
| 5696 1685 3207 415 7019 5023 5608 2605 857 6915 1770 8016 |
| 3992 771 2190 7258 8970 7792 1802 1866 6137 8841 886 1931 |
| 4108 3781 7577 6810 9322 8226 5396 5867 4428 8827 7766 2254 |
| 4247 888 4367 8821 9660 324 5864 4774 227 7889 6405 8963 |
| 9693 500 2520 2227 1811 9330 1928 5140 4030 4824 806 3134 |
| 1652 8171 1435 |
| 3366 6543 3745 |
| 9286 8509 4645 |
| 7397 5790 8972 |
| 6597 4422 1799 |
| 9276 4041 3847 |
| 8683 7378 4946 |
| 5348 1993 9186 |
| 6724 9015 5646 |
| 4502 4439 8474 |
| 5107 7342 9442 |
| 1387 8910 2660 |

10. The apparatus according to claim 9, wherein the coded signal includes an 8-bit cyclic redundancy check (CRC) code with generator polynomial $(x^5+x^4+x^3+x^2+1)(x^2+x+1)(x+1)$.

11. The apparatus according to claim 9, wherein the coded signal further includes an outer code that is based on Bose Chaudhuri Hocquenghem (BCH) codes.

12. The apparatus according to claim 11, wherein information bits are accumulated at parity bit addresses according to $\{x+m \bmod 360 \times q\} \bmod(n_{ldpc}-k_{ldpc})$, where $n_{ldpc}$ is the codeword size, $k_{ldpc}$ is the information block size, m is an integer corresponding to a particular information bit, q is the code rate, and x denotes the address of the parity bit accumulator as specified by the respective tables.

13. The apparatus according to claim 11 wherein, for the 1/3 rate code, $q=120$, $n_{ldpc}=64800$, $k_{ldpc}=n_{BCH}=21600$, $k_{BCH}=21408$ (12 bit error correcting BCH).

14. The apparatus according to claim 11, wherein, for the 1/4 rate code, $q=135$, $n_{ldpc}=64800$, $k_{ldpc}=n_{BCH}=16200$, $k_{BCH}=16008$ (12 bit error correcting BCH).

15. The apparatus according to claim 11, wherein, for the 2/5 rate code, $q=108$, $n_{ldpc}=64800$, $k_{ldpc}=n_{BCH}=25920$, $k_{BCH}=25728$ (12 bit error correcting BCH).

16. The apparatus according to claim 9, further comprising:

demodulator circuit configured to demodulate the LDPC coded signal according to one of 8-PSK (Phase Shift Keying), 16-QAM (Quadrature Amplitude Modulation), QPSK (Quadrature Phase Shift Keying), 16-APSK (Amplitude Phase Shift Keying) or 32-APSK.

17. A receiver comprising:

a decoder configured to receive an Low Density Parity Check (LDPC) coded signal and to decode the signal by accessing edge values to satisfy parity check equations relating to LPDC codes having one of a code rate of 1/3, a code rate of 1/4, or a code rate of 2/5 associated with respective tables each specifying address of parity bit accumulators,

| Address of Parity Bit Accumulators (Rate 1/3) |
| --- |
| 34903 20927 32093 1052 25611 16093 16454 5520 506 37399 18518 21120 |
| 11636 14594 22158 14763 15333 6838 22222 37856 14985 31041 18704 32910 |
| 17449 1665 35639 16624 12867 12449 10241 11650 25622 34372 19878 26894 |
| 29235 19780 36056 20129 20029 5457 8157 35554 21237 7943 13873 14980 |
| 9912 7143 35911 12043 17360 37253 25588 11827 29152 21936 24125 40870 |
| 40701 36035 39556 12366 19946 29072 16365 35495 22686 11106 8756 34863 |
| 19165 15702 13536 40238 4465 40034 40590 37540 17162 1712 20577 14138 |
| 31338 19342 9301 39375 3211 1316 33409 28670 12282 6118 29236 35787 |
| 11504 30506 19558 5100 24188 24738 30397 33775 9699 6215 3397 37451 |
| 34689 23126 7571 1058 12127 27518 23064 11265 14867 30451 28289 2966 |
| 11660 15334 16867 15160 38343 3778 4265 39139 17293 26229 42604 13486 |
| 31497 1365 14828 7453 26350 41346 28643 23421 8354 16255 11055 24279 |
| 15687 12467 13906 5215 41328 23755 20800 6447 7970 2803 33262 39843 |
| 5363 22469 38091 28457 36696 34471 23619 2404 24229 41754 1297 18563 |
| 3673 39070 14480 30279 37483 7580 29519 30519 39831 20252 18132 20010 |
| 34386 7252 27526 12950 6875 43020 31566 39069 18985 15541 40020 16715 |
| 1721 37332 39953 17430 32134 29162 10490 12971 28581 29331 6489 35383 |
| 736 7022 42349 8783 6767 11871 21675 10325 11548 25978 431 24085 |
| 1925 10602 28585 12170 15156 34404 8351 13273 20208 5800 15367 21764 |
| 16279 37832 34792 21250 34192 7406 41488 18346 29227 26127 25493 7048 |
| 39948 28229 24899 |
| 17408 14274 38993 |
| 38774 15968 28459 |
| 41404 27249 27425 |
| 41229 6082 43114 |
| 13957 4979 40654 |
| 3093 3438 34992 |
| 34082 6172 28760 |
| 42210 34141 41021 |
| 14705 17783 10134 |
| 41755 39884 22773 |
| 14615 15593 1642 |
| 29111 37061 39860 |
| 9579 33552 633 |
| 12951 21137 39608 |
| 38244 27361 29417 |
| 2939 10172 36479 |
| 29094 5357 19224 |
| 9562 24436 28637 |
| 40177 2326 13504 |
| 6834 21583 42516 |
| 40651 42810 25709 |
| 31557 32138 38142 |
| 18624 41867 39296 |
| 37560 14295 16245 |
| 6821 21679 31570 |
| 25339 25083 22081 |
| 8047 697 35268 |
| 9884 17073 19995 |
| 26848 35245 8390 |
| 18658 16134 14807 |
| 12201 32944 5035 |
| 25236 1216 38986 |
| 42994 24782 8681 |
| 28321 4932 34249 |
| 4107 29382 32124 |
| 22157 2624 14468 |
| 38788 27081 7936 |
| 4368 26148 10578 |
| 25353 4122 39751 |

| Address of Parity Bit Accumulators (Rate ¼) |
|---|
| 23606 36098 1140 28859 18148 18510 6226 540 42014 20879 23802 47088 |
| 16419 24928 16609 17248 7693 24997 42587 16858 34921 21042 37024 20692 |
| 1874 40094 18704 14474 14004 11519 13106 28826 38669 22363 30255 31105 |
| 22254 40564 22645 22532 6134 9176 39998 23892 8937 15608 16854 31009 |
| 8037 40401 13550 19526 41902 28782 13304 32796 24679 27140 45980 10021 |
| 40540 44498 13911 22435 32701 18405 39929 25521 12497 9851 39223 34823 |
| 15233 45333 5041 44979 45710 42150 19416 1892 23121 15860 8832 10308 |
| 10468 44296 3611 1480 37581 32254 13817 6883 32892 40258 46538 11940 |
| 6705 21634 28150 43757 895 6547 20970 28914 30117 25736 41734 11392 |
| 22002 5739 27210 27828 34192 37992 10915 6998 3824 42130 4494 35739 |
| 8515 1191 13642 30950 25943 12673 16726 34261 31828 3340 8747 39225 |
| 18979 17058 43130 4246 4793 44030 19454 29511 47929 15174 24333 19354 |
| 16694 8381 29642 46516 32224 26344 9405 18292 12437 27316 35466 41992 |
| 15642 5871 46489 26723 23396 7257 8974 3156 37420 44823 35423 13541 |
| 42858 32008 41282 38773 26570 2702 27260 46974 1469 20887 27426 38553 |
| 22152 24261 8297 |
| 19347 9978 27802 |
| 34991 6354 33561 |
| 29782 30875 29523 |
| 9278 48512 14349 |
| 38061 4165 43878 |
| 8548 33172 34410 |
| 22535 28811 23950 |
| 20439 4027 24186 |
| 38618 8187 30947 |
| 35538 43880 21459 |
| 7091 45616 15063 |
| 5505 9315 21908 |
| 36046 32914 11836 |
| 7304 39782 33721 |
| 16905 29962 12980 |
| 11171 23709 22460 |
| 34541 9937 44500 |
| 14035 47316 8815 |
| 15057 45482 24461 |
| 30518 36877 879 |
| 7583 13364 24332 |
| 448 27056 4682 |
| 12083 31378 21670 |
| 1159 18031 2221 |
| 17028 38715 9350 |
| 17343 24530 29574 |
| 46128 31039 32818 |
| 20373 36967 18345 |
| 46685 20622 32806 |

| Address of Parity Bit Accumulators (Rate ⅔) |
|---|
| 5650 4143 8750 583 6720 8071 635 1767 1344 6922 738 6658 |
| 5696 1685 3207 415 7019 5023 5608 2605 857 6915 1770 8016 |
| 3992 771 2190 7258 8970 7792 1802 1866 6137 8841 886 1931 |
| 4108 3781 7577 6810 9322 8226 5396 5867 4428 8827 7766 2254 |
| 4247 888 4367 8821 9660 324 5864 4774 227 7889 6405 8963 |
| 9693 500 2520 2227 1811 9330 1928 5140 4030 4824 806 3134 |
| 1652 8171 1435 |
| 3366 6543 3745 |
| 9286 8509 4645 |
| 7397 5790 8972 |
| 6597 4422 1799 |
| 9276 4041 3847 |
| 8683 7378 4946 |
| 5348 1993 9186 |
| 6724 9015 5646 |
| 4502 4439 8474 |
| 5107 7342 9442 |
| 1387 8910 2660. |

18. The receiver according to claim 17, wherein the coded signal includes an 8-bit cyclic redundancy check (CRC) code with generator polynomial $(x^5+x^4+x^3+x^2+1)(x^2+x+1)(x+1)$, the receiver further comprising:

CRC logic configured to decode the CRC code.

19. The receiver according to claim 17, wherein the coded signal further includes an outer code that is based on Bose Chaudhuri Hocquenghem (BCH) codes, the receiver further comprising:

BCH logic configured to decode the outer BCH code.

20. The receiver according to claim 19, wherein information bits are accumulated at parity bit addresses according to $\{x+m \bmod 360 \times q\} \bmod(n_{ldpc}-k_{ldpc})$, where $n_{ldpc}$ is the codeword size, $k_{ldpc}$ is the information block size, m is an integer corresponding to a particular information bit, q is the code rate, and x denotes the address of the parity bit accumulator as specified by the respective tables.

21. The receiver according to claim 19, wherein, for the 1/3 rate code, $q=120$, $n_{ldpc}=64800$, $k_{ldpc}=n_{BCH}=21600$, $k_{BCH}=21408$ (12 bit error correcting BCH).

22. The receiver according to claim 19, wherein, for the 1/4 rate code, $q=135$, $n_{ldpc}=64800$, $k_{ldpc}=n_{BCH}=16200$, $k_{BCH}=16008$ (12 bit error correcting BCH).

23. The receiver according to claim 19, wherein, for the 2/5 rate code, $q=108$, $n_{ldpc}=64800$, $k_{ldpc}=n_{BCH}=25920$, $k_{BCH}=25728$ (12 bit error correcting BCH).

24. The receiver according to claim 17, further comprising:
a demodulator configured to demodulate the LDPC coded signal according to one of 8-PSK (Phase Shift Keying), 16-QAM (Quadrature Amplitude Modulation), QPSK (Quadrature Phase Shift Keying), 16-APSK (Amplitude Phase Shift Keying) or 32-APSK.

* * * * *